(12) United States Patent
Mizutani et al.

(10) Patent No.: US 10,947,484 B2
(45) Date of Patent: *Mar. 16, 2021

(54) STRIPPING COMPOSITIONS FOR REMOVING PHOTORESISTS FROM SEMICONDUCTOR SUBSTRATES

(71) Applicant: Fujifilm Electronic Materials U.S.A., Inc., N. Kingstown, RI (US)

(72) Inventors: Atsushi Mizutani, Woluwe-Saint-Lambert (BE); William A. Wojtczak, Mesa, AZ (US); Yasuo Sugishima, Gilbert, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/378,635

(22) Filed: Apr. 9, 2019

(65) Prior Publication Data

US 2019/0233771 A1    Aug. 1, 2019

Related U.S. Application Data

(63) Continuation of application No. 15/597,395, filed on May 17, 2017, now Pat. No. 10,266,799.

(60) Provisional application No. 62/340,204, filed on May 23, 2016.

(51) Int. Cl.
| | |
|---|---|
| *C11D 7/50* | (2006.01) |
| *C11D 11/00* | (2006.01) |
| *G03F 7/42* | (2006.01) |
| *C11D 3/00* | (2006.01) |
| *C11D 3/20* | (2006.01) |
| *C11D 3/28* | (2006.01) |
| *C11D 3/30* | (2006.01) |
| *C11D 3/34* | (2006.01) |
| *C11D 3/43* | (2006.01) |
| *H01L 21/311* | (2006.01) |

(52) U.S. Cl.
CPC ........ *C11D 11/0047* (2013.01); *C11D 3/0073* (2013.01); *C11D 3/2065* (2013.01); *C11D 3/2082* (2013.01); *C11D 3/2086* (2013.01); *C11D 3/28* (2013.01); *C11D 3/30* (2013.01); *C11D 3/3427* (2013.01); *C11D 3/43* (2013.01); *G03F 7/423* (2013.01); *G03F 7/425* (2013.01); *G03F 7/426* (2013.01); *H01L 21/31111* (2013.01); *H01L 21/31133* (2013.01)

(58) Field of Classification Search
CPC ................................................ C11D 11/0047
USPC ...................................................... 510/175
See application file for complete search history.

(56) References Cited

U.S. PATENT DOCUMENTS

| | | | |
|---|---|---|---|
| 9,012,387 B2 | 4/2015 | Atkinson et al. | |
| 9,360,761 B2 | 6/2016 | Choi | |
| 9,914,902 B2* | 3/2018 | Du | ......... C11D 3/2006 |
| 10,266,799 B2* | 4/2019 | Mizutani | ................ C11D 3/43 |
| 2005/0130082 A1 | 6/2005 | Kanda et al. | |
| 2005/0245422 A1 | 11/2005 | Yamada et al. | |
| 2006/0063687 A1 | 3/2006 | Minsek et al. | |
| 2006/0154186 A1 | 7/2006 | Minsek et al. | |
| 2009/0082240 A1 | 3/2009 | Nukui et al. | |
| 2010/0152086 A1* | 6/2010 | Wu | .......... C11D 7/265 510/175 |
| 2010/0261632 A1* | 10/2010 | Korzenski | ............... C11D 7/36 510/175 |
| 2012/0042898 A1 | 2/2012 | Visintin et al. | |
| 2012/0129095 A1 | 5/2012 | Levanon et al. | |
| 2013/0109605 A1 | 5/2013 | Rath et al. | |
| 2016/0186106 A1 | 6/2016 | Du et al. | |
| 2017/0278701 A1 | 9/2017 | Oie et al. | |

FOREIGN PATENT DOCUMENTS

| | | | |
|---|---|---|---|
| CN | 1618041 A | 5/2005 | |
| CN | 1693439 | 11/2005 | ............... C11D 3/26 |
| CN | 101137939 A | 3/2008 | |
| CN | 102466986 A | 5/2012 | |
| CN | 102893218 A | 1/2013 | |
| CN | 103189803 A | 7/2013 | |
| EP | 2 482 134 | 8/2012 | ............... G03F 7/30 |
| JP | 2002-107953 A | 4/2002 | |
| JP | 2012-9513 | 1/2012 | ........... H01L 21/304 |
| WO | WO 2006/056298 | 6/2006 | ............... C11D 7/50 |
| WO | WO 2008/039730 | 4/2008 | ............... C11D 7/32 |
| WO | WO 2011/142600 | 11/2011 | ............... G03F 7/42 |

(Continued)

OTHER PUBLICATIONS

Extended European Search Report for European Application No. EP 19166565 dated Jul. 24, 2019.

(Continued)

*Primary Examiner* — Gregory E Webb

(74) *Attorney, Agent, or Firm* — Fish & Richardson P.C.

(57) ABSTRACT

This disclosure relates to compositions containing 1) at least one water soluble polar aprotic organic solvent; 2) at least one quaternary ammonium hydroxide; 3) at least one carboxylic acid; 4) at least one Group II metal cation; 5) at least one copper corrosion inhibitor selected from the group consisting of 6-substituted-2,4-diamino-1,3,5-triazines; and 6) water. The compositions can effectively strip positive or negative-tone resists or resist residues, and be non-corrosive to bumps and underlying metallization materials (such as SnAg, CuNiSn, CuCoCu, CoSn, Ni, Cu, Al, W, Sn, Co, and the like) on a semiconductor substrate.

41 Claims, No Drawings

(56) References Cited

FOREIGN PATENT DOCUMENTS

| WO | WO 2012/009639 | 1/2012 | ........... H01L 21/302 |
| WO | WO 2016/076031 | 5/2016 | ........... H01L 21/304 |
| WO | WO 2016/109387 | 7/2016 | ............... G03F 7/32 |
| WO | WO 2017/205134 | 11/2017 | ............... B08B 3/00 |

OTHER PUBLICATIONS

International Search Report and Written Opinion of the International Searching Authority for International Application No. PCT/US17/33041 dated Aug. 17, 2017.
European Search Report for European Application No. EP 17 17 2498 dated Aug. 24, 2017.
Office Action and Search Report issued in Taiwan Application No. TW 106116911 dated Oct. 22, 2020 (With English summary).
International Search Report and Written Opinion of the International Searching Authority for International Application No. PCT/US2020/028473 dated Jul. 17, 2020.
Communication from the European Patent Office for European Patent Application No. EP 19 166 565.2, dated Sep. 21, 2020.
Office Action for Chinese Application No. CN 201780030713.4, dated Jan. 26, 2021 (with machine English Translation).

\* cited by examiner

STRIPPING COMPOSITIONS FOR REMOVING PHOTORESISTS FROM SEMICONDUCTOR SUBSTRATES

CROSS-REFERENCE TO RELATED APPLICATIONS

The present application is a continuation of U.S. Utility application Ser. No. 15/597,395, filed on May 17, 2017, which claims priority to U.S. Provisional Application Ser. No. 62/340,204, filed on May 23, 2016. The contents of the parent applications are hereby incorporated by reference in their entirety.

FIELD OF THE DISCLOSURE

The present disclosure relates generally to novel stripping compositions for removal of photoresists (e.g., positive or negative photoresists) or photoresist residues from semiconductor substrates. Specifically, the present disclosure relates to alkaline compositions useful for removing photoresists or photoresist residues after an etching or plasma ashing process.

BACKGROUND OF THE DISCLOSURE

In the manufacture of integrated circuits, a flip chip process known as Controlled Collapse Chip Connection (C4) process for interconnecting semiconductor devices, such as IC chips and microelectromechanical systems (MEMS) to external circuitry with solder bumps that have been deposited onto the chip pads, has now become quite well established. Thick negative-tone photoresist is commonly applied during flip chip or C4 processes and commercially available resist stripping formulations for thick negative-tone resist are predominantly DMSO (dimethylsulfoxide) or NMP (N-methylpyrrolidone) plus TMAH (tetramethylammonium hydroxide) based formulations. However, those commercially available resist stripping formulations for thick negative-tone resist may exhibit the problems of insufficient resist stripping capability, short bath life, or poor compatibility with metal substrates and bump compositions. In addition, foaming issues produced by the dissolved photoresist or the surfactants in the dissolved photoresist can occur.

SUMMARY OF THE DISCLOSURE

This disclosure describes the development of resist stripping compositions tailored for devices containing bumps and metallization materials (such as SnAg, CuNiSn, CuCoCu, CoSn, Ni, Cu, Al, W, Sn, Co, and the like). The inventors discovered unexpectedly that the ability to effectively strip thick positive or negative-tone resist and be non-corrosive to bumps and underlying metallization materials (such as SnAg, CuNiSn, CuCoCu, CoSn, Ni, Cu, Al, W, Sn, Co, and the like) can be achieved by using the compositions of the present disclosure. Indeed, it has been discovered that the compositions of the disclosure are effective in suppressing Cu and Al etching while maintaining excellent stripping and cleaning performance. In addition, the compositions of this disclosure exhibit broad material compatibility and can effectively control foaming issues during the stripping process.

In some embodiments, this disclosure features a photoresist stripping composition that includes 1) at least one water soluble polar aprotic organic solvent;
2) at least one quaternary ammonium hydroxide;
3) at least one carboxylic acid;
4) at least one Group II metal cation;
5) at least one copper corrosion inhibitor selected from the group consisting of 6-substituted-2,4-diamino-1,3,5-triazines; and
6) water.

In some embodiments, this disclosure concerns a photoresist stripping method that includes contacting a semiconductor substrate containing a photoresist or a photoresist residue with a photoresist stripping composition of this disclosure to remove the photoresist or photoresist residue. In some embodiments, the stripping method further includes forming a semiconductor device (e.g., an integrated circuit device such as a semiconductor chip) from the semiconductor substrate obtained by the method described above.

DETAILED DESCRIPTION OF THE DISCLOSURE

Definitions

As defined herein, unless otherwise noted, all percentages expressed should be understood to be percentages by weight to the total weight of the stripping composition. Unless otherwise noted, ambient temperature is defined to be between about 16 and about 27 degrees Celsius (° C.).

As defined herein, a "water-soluble" substance (e.g., a water-soluble alcohol, ketone, ester, ether, and the like) refers to a substance having a solubility of at least 5% by weight in water at 25° C.

As used herein, the term "polar aprotic solvent" refers to a solvent that lacks an acidic proton and has a relatively high dipole moment (e.g., at least 2.7).

As defined herein, a "Group II metal cation" refers to a cation of a metal in Group II of the Periodic Table.

Tautomerization is herein defined as the formal migration of a hydrogen atom or proton accompanied by a switch of a single and an adjacent double bond. The mention, description, or claim of triazole compounds also includes the tautomers of the triazole compounds due to the low activation energy for tautomerization in the triazole ring system.

As defined herein, the term "triazole" does not include annelated triazoles such as benzotriazole or naphthotriazole or their derivatives. Although the triazoles of this disclosure may have cyclic substituents, the substituents are attached to the ring at only one carbon.

In some embodiments, this disclosure concerns a photoresist stripping composition including 1) at least one water soluble polar aprotic organic solvent;
2) at least one quaternary ammonium hydroxide;
3) at least one carboxylic acid;
4) at least one Group II metal cation;
5) at least one copper corrosion inhibitor selected from the group consisting of 6-substituted-2,4-diamino-1,3,5-triazines; and
6) water.

In some embodiments, the stripping compositions of this disclosure contain at least one water soluble polar aprotic organic solvent. The water soluble polar aprotic organic solvent can be one water soluble solvent or a mixture of water soluble solvents in any ratio. Examples of such solvents suitable for use in the present disclosure include, but are not limited to, dimethyl sulfoxide, sulfolane, dimethylsulfone, N,N-dimethylformamide, N,N-dimethylacetamide, N-methylpyrrolidone, gamma-butyrolactone, propylene carbonate, 1,3-dimethyl-2-imidazolidinone and mixtures thereof. In some embodiments, the water soluble polar aprotic organic solvent is dimethyl sulfoxide, sulfolane, gamma-butyrolactone, or N-methylpyrrolidone.

In some embodiments, the compositions of this disclosure contain the at least one water soluble polar aprotic organic solvent in an amount of at least about 30% by weight (e.g., at least about 40% by weight, at least about 50% by weight or at least about 60% by weight) and/or at most about 90% by weight (e.g., at most about 85% by weight, at most about 80% by weight or at most about 75% by weight).

Optionally, the stripping compositions of this disclosure contain at least one alcohol solvent, such as a water soluble alcohol solvent. Classes of water soluble alcohol solvents include, but are not limited to, alkane diols (including, but not limited to, alkylene glycols), glycols, alkoxyalcohols (including but not limited to glycol monoethers), saturated aliphatic monohydric alcohols, unsaturated non-aromatic monohydric alcohols, alcohols (e.g., low molecular weight alcohols) containing a ring structure, and mixtures thereof. The stripping compositions can include one alcohol solvent or a mixture of alcohol solvents in any ratio. In some embodiments, the compositions of the disclosure do not contain at least one alcohol solvent.

Examples of water soluble alkane diols include, but are not limited to, 2-methyl-1,3-propanediol, 1,3-propanediol, 2,2-dimethyl-1,3-diol, 1,4-butanediol, 1,3-butanediol, 1,2-butanediol, 2,3-butanediol, pinacol, and alkylene glycols.

Examples of water soluble alkylene glycols include, but are not limited to, ethylene glycol, propylene glycol, hexylene glycol, diethylene glycol, dipropylene glycol, triethylene glycol, and tetraethyleneglycol.

Examples of water soluble alkoxyalcohols include, but are not limited to, 3-methoxy-3-methyl-1-butanol, 3-methoxy-1-butanol, 1-methoxy-2-butanol, and water soluble glycol monoethers.

Examples of water soluble glycol monoethers include, but are not limited to, ethylene glycol monomethyl ether, ethylene glycol monoethyl ether, ethylene glycol mono n-propyl ether, ethylene glycol monoisopropyl ether, ethylene glycol mono n-butyl ether, diethylene glycol monomethyl ether, diethylene glycol monoethyl ether, diethylene glycol monobutylether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

Examples of water soluble saturated aliphatic monohydric alcohols include, but are not limited to, methanol, ethanol, n-propyl alcohol, isopropyl alcohol, 1-butanol, 2-butanol, isobutyl alcohol, tert-butyl alcohol, 2-pentanol, t-pentyl alcohol, and 1-hexanol.

Examples of water soluble unsaturated non-aromatic monohydric alcohols include, but are not limited to, allyl alcohol, propargyl alcohol, 2-butenyl alcohol, 3-butenyl alcohol, and 4-penten-2-ol.

Examples of water soluble, low molecular weight alcohols containing a ring structure include, but are not limited to, tetrahydrofurfuryl alcohol, furfuryl alcohol, and 1,3-cyclopentanediol.

In some embodiments, the water soluble alcohol solvents are, alkoxyalcohols, tetrahydrofurfuryl alcohol, and water soluble alkanediols. In some embodiments, the water soluble alcohol solvents are 3-methoxy-3-methyl-1-butanol, 3-methoxy-1-butanol, 1-methoxy-2-butanol, water soluble glycol monoethers, water soluble alkylene glycols, and tetrahydrofurfuryl alcohol. In some embodiments, the water soluble alcohol solvents are 3-methoxy-3-methyl-1-butanol, diethylene glycol monomethyl ether, diethylene glycol monoethyl ether, ethylene glycol mono n-butyl ether, propylene glycol, hexylene glycol, and tetrahydrofurfuryl alcohol.

In some embodiments, when the photoresist stripping method described herein employs a heated photoresist stripping composition described herein, the water soluble alcohols can have a boiling point above 110° C. for safety considerations.

In some embodiments, the stripping compositions of this disclosure contain the at least one alcohol solvent in an amount of at least about 5% by weight (e.g., at least about 7% by weight, at least about 10% by weight or at least about 12% by weight) and/or at most about 60% by weight (e.g., at most about 45% by weight, at most about 35% by weight or at most about 25% by weight).

In some embodiments, the stripping compositions of this disclosure contain at least one quaternary ammonium hydroxide. In some embodiments, the preferred quaternary ammonium hydroxide is a compound represented by the general formula $[NR_1R_2R_3R_4]^+OH$, where $R_1$, $R_2$, $R_3$, and $R_4$ are independently a linear, branched or cyclic alkyl group optionally substituted by hydroxy, a substituted or unsubstituted phenyl group, or a substituted or unsubstituted benzyl group(e.g., a benzyl group substituted or unsubstituted on its phenyl group). Substituents on the phenyl group and on the phenyl group of the benzyl group may include halogen, hydroxyl, alkoxy, or alkyl. In some embodiments, the quaternary ammonium hydroxide is a tetralkylammonium hydroxide. In some embodiments, the quaternary ammonium hydroxide is a tetralkanol ammonium hydroxide. In some embodiments, the quaternary ammonium hydroxide is a mixture of two or more quaternary ammonium hydroxides in any ratio.

In some embodiments, the preferred quaternary ammonium hydroxide is a compound of the general formula $[NR_1R_2R_3R_4]^+OH$, where $R_1$, $R_2$, $R_3$, and $R_4$ are independently a $C_1$-$C_4$ alkyl group, a hydroxyethyl group, a phenyl group, or a benzyl group.

Examples of suitable quaternary ammonium hydroxide compounds include, but are not limited to, tetramethylammonium hydroxide (TMAH), tetraethylammonium hydroxide (TEAH), tetrapropylammonium hydroxide, tetrabutylammonium hydroxide (TBAH), ethyltrimethylammonium hydroxide, diethyldimethylammonium hydroxide, methyltripropylammonium hydroxide, butyltrimethylammonium hydroxide, methyltributylammonium hydroxide, pentyltrimethylammonium hydroxide, (2-hydroxyethyl)trimethylammonium hydroxide (choline), (2-hydroxyethyl)triethylammonium hydroxide, (2-hydroxyethyl)triethyl-ammonium hydroxide, (3-hydroxypropyll)triethylammonium hydroxide, tris-2-hydroxyethylammonium hydroxide, tetraethanolammonium hydroxide, phenyltrimethylammonium hydroxide, benzyltrimethylammonium hydroxide and mixtures thereof.

In some embodiments, the quaternary ammonium hydroxide is tetramethylammonium hydroxide, (2-hydroxyethyl) trimethylammonium hydroxide (choline), benzyltrimethylammonium hydroxide, tetrabutylammonium hydroxide, or tetraethanolammonium hydroxide.

In some embodiments, the quaternary ammonium hydroxide is TMAH, TEAH, TBAH, choline, or tetraethanolammonium hydroxide.

In some embodiments, the stripping compositions of this disclosure contain the at least one quaternary ammonium hydroxide in an amount of at least about 0.1% by weight (e.g., at least about 0.5% by weight, at least about 1% by weight or at least about 1.5% by weight) and/or at most about 10% by weight (e.g., at most about 8% by weight, at most about 5% by weight or at most about 3% by weight).

In some embodiments, the stripping compositions of the disclosure include at least one Group II metal cation. Examples of suitable Group II metal cations include $Ca^{2+}$, $Mg^{2+}$, $Sr^{2+}$, and $Ba^{2+}$. In some embodiments, the stripping compositions described herein can include the Group II metal cation in an amount of at least about 5 ppm (e.g., at least about 7 ppm, at least about 8 ppm, or at least about 10 ppm) and/or at most about 40 ppm (e.g., at most about 35 ppm, at most about 25 ppm, at most about 20 ppm, or at most about 15 ppm).

Without wishing to be bound by theory, it is believed that a stripping composition containing solubilized Group II metal cations (e.g., calcium cation) can significantly reduce the Al etch rate of the stripping composition, thereby allowing the stripping composition to inhibit Al etch during use. Further, without wishing to be bound by theory, it is believed that, as Group II metal compounds are generally not very soluble in the stripping compositions described herein, adding an agent that can solubilize Group II metal cations (e.g., by forming a complex with a Group II metal cation) can significantly increase the amount of the solubilized Group II metal cations in the stripping compositions, thereby improving their Al etch inhibition abilities.

Thus, in some embodiments, the stripping compositions of the disclosure can include one or more compounds that improve the solubility of Group II metal cations in water soluble polar aprotic organic solvents. These compounds include compounds having at least three hydroxyl groups. In some embodiments, the compounds are sugar alcohols. Sugar alcohols contemplated for use in the compositions of the disclosure include, but are not limited to, glycerol, sorbitol, mannitol, erythritol, arabitol, isomalt, lactitol, maltitol, xylitol, threitol, ribitol, galactitol, iditol, and inositol. In some embodiments, the sugar alcohol is glycerol or sorbitol.

In some embodiments, the stripping compositions described herein can include at least at least one compound having at least three hydroxyl groups in an amount of about 0.1% by weight (e.g., at least about 0.5% by weight, at least about 1% by weight or at least about 1.5% by weight) and/or at most about 10% by weight (e.g., at most about 8% by weight, at most about 5% by weight or at most about 3% by weight).

In some embodiments, the stripping compositions of the disclosure can also include at least one carboxylic acid. Without wishing to be bound by theory, it is believed that carboxylic acids act in concert with compounds having at least three hydroxyl groups can improve the solubility of Group II metal cations in water soluble polar aprotic organic solvents. In some embodiments, examples of the at least one carboxylic acid contemplated for use in the compositions of the disclosure include, but are not limited to, monocarboxylic acids, bicarboxylic acids, tricarboxylic acids, α-hydroxyacids and β-hydroxyacids of monocarboxylic acids, α-hydroxyacids or β-hydroxyacids of bicarboxylic acids, or α-hydroxyacids and β-hydroxyacids of tricarboxylic acids. In some embodiments, the at least one carboxylic acid includes citric acid, maleic acid, fumaric acid, lactic acid, glycolic acid, oxalic acid, tartaric acid, succinic acid, or benzoic acid. In some embodiments, the carboxylic acid is citric acid.

In some embodiments, the stripping compositions described herein can include the at least one carboxylic acid in an amount of at least about 0.1% by weight (e.g., at least about 0.2% by weight, at least about 0.3% by weight or at least about 0.4% by weight) and/or at most about 1.5% by weight (e.g., at most about 1.2% by weight, at most about 0.9% by weight or at most about 0.6% by weight).

The stripping compositions of the present disclosure generally contain water. In some embodiments, the water is de-ionized and ultra-pure, contains no organic contaminants and has a minimum resistivity of about 4 to about 17 mega Ohms. In some embodiments, the resistivity of the water is at least 17 mega Ohms.

In some embodiments, the stripping compositions of this disclosure contain water in an amount of at least about 2.5% by weight (e.g., at least about 5% by weight, at least about 7% by weight or at least about 10% by weight) and/or at most about 25% by weight (e.g., at most about 20% by weight, at most about 15% by weight or at most about 12.5% by weight).

In some embodiments, the stripping compositions of the present disclosure include at least one copper corrosion inhibitor, which is a 6-substituted-2,4-diamino-1,3,5-triazine. The substituent on the 2,4-diamino-1,3,5-triazine can be a linear or branched substituted or unsubstituted $C_1$-$C_{12}$ alkyl group (e.g., methyl, hexyl, —$CH_2$-aryl, $CH_2OR^{100}$, —$CH_2SR^{100}$, —$CH_2(NR^{100}R^{R101})$), a substituted or unsubstituted $C_3$-$C_{12}$ cycloalkyl group (e.g., cyclohexyl, methylcyclohexyl, or hydroxycyclohexyl), a substituted or unsubstituted aryl group (e.g., phenyl, methoxyphenyl, or naphthyl), —$SCH_2R^{100}$, —$N(R^{100}R^{101})$, or imidyl, where each of $R^{100}$ and $R^{101}$, independently, is a linear or branched, substituted or unsubstituted $C_1$-$C_{12}$ alkyl group optionally containing a nitrogen or oxygen atom in the alkyl chain, a substituted or unsubstituted $C_3$-$C_{12}$ cycloalkyl group optionally containing a nitrogen or oxygen atom in the cycloalkyl ring, a substituted or unsubstituted aryl group, or $R^{100}$ and $R^{101}$, together with the atom to which they are attached, form a ring. Substituents on the alkyl and cycloalkyl groups can include, $C_1$-$C_4$ alkyl, $C_1$-$C_4$ alkoxy, hydroxyl, and substituted or unsubstituted aryl. In some embodiments, substituents on the aryl groups are electron donating (e.g., alkoxy) rather than electron withdrawing (e.g., halogen).

Examples of suitable 6-substituted-2,4-diamino-1,3,5-triazines include 6-methyl-2,4-diamino-1,3,5-triazine; 6-phenyl-2,4-diamino-1,3,5-dimethyltriazine; 1,3,5-triazine-2,4-diamine, 6-[2-(2-furanyl)ethyl]-; 1,3,5-triazine-2,4-diamine, 6-[(hexahydro-1-methylpyrrolo[3,4-c]pyrrol-2(1H)-yl) methyl]-; 1,3,5-triazine-2,4-diamine, 6-[[(3-aminobutyl) thio]methyl]-; 1,3,5-triazine-2,4-diamine, 6-(4,4-difluorocyclohexyl)-; 1,3,5-triazine-2,4-diamine, 6-[(3-chlorophenyl) methyl]-; 1,3,5-triazine-2,4-diamine, 6-[(phenylthio) methyl]-; 1,3,5-triazine-2,4-diamine, 6-[(tetrahydro-2H-pyran-2-yl)methyl]-; 2-(4,6-diamino-1,3,5-triazin-2-yl)-4-fluoro-phenol; 1,3,5-triazine-2,4-diamine, 6(1-ethylcyclopentyl)-; 1,3,5-triazine-2,4-diamine, 6-[[4-(diphenylmethyl)-1-piperazinyl]methyl]-; 9-acridinecarboxylic acid, 1,2,3,4-tetrahydro-4-[(4-methoxyphenyl)methylene]-, (4,6-diamino-1,3,5-triazin-2-yl)methyl ester; 1H-Benz[de]isoquinoline-1,3(2H)-dione, 2-[[(4,6-diamino-1,3,5-triazin-2-yl)amino]methyl]-; 9-acridinecarboxylic acid, 2-(1,1-dimethylpropyl)-1,2,3,4-tetrahydro-,(4,6-diamino-1,3,5-triazin-2-yl)methyl ester; 1,3,5-triazine-2,4,6-triamine, N2-[2-[(7-chloro-4-quinolinyl)

amino]ethyl]-;1,3,5-triazine-2,4-diamine, 6-[[4-(1-methylethyl)phenoxy]methyl]-; 1,3,5-triazine-2,4-diamine, 6-[[3-(trifluoromethyl)phenoxy]methyl]-; 1,3,5-triazine-2,4-diamine, 6-[[(tetrahydro-2H-pyran-2-yl)methyl]thio]-; N-cyclohexyl-2-[(4,6-diamino-1,3,5-triazin-2-yl)thio]-propanamide;3-chloro-4-[(4,6-diamino-1,3,5-triazin-2-yl)methoxy]-5-methoxy-benzonitrile; benzeneacetic acid, 3-methoxy-, (4,6-diamino-1,3,5-triazin-2-yl)methyl ester; 1,3,5-triazine-2,4-diamine, 6-[3-(1-pyrrolidinyl)phenyl]-; 1,3,5-triazine-2-octanenitrile, 4,6-diamino-; s-triazine-2-butyronitrile, 4,6-diamino-; 1,3,5-triazine-2-propanoic acid, 4,6-diamino-; 1,3,5-triazine-2-methanethiol, 4,6-diamino-; benzamide, N-(4,6-diamino-1,3,5-triazin-2-yl)-4-hydroxy-; and 1,3,5-triazine-2,4-diamine, 6-[(methylthio)methyl]-.

In some embodiments, the stripping compositions of this disclosure contain at least one copper corrosion inhibitor in an amount of at least about 0.01% by weight (e.g., at least about 0.05% by weight, at least about 0.1% by weight or at least about 0.5% by weight) and/or at most about 10% by weight (e.g., at most about 7% by weight, at most about 5% by weight or at most about 2% by weight).

The stripping compositions of the present disclosure optionally include a defoaming surfactant. Examples of suitable defoaming surfactants include polysiloxanes (e.g., polydimethylsiloxane), polyethylene glycol methyl ether polymers, ethylene oxide/propylene oxide copolymers, tetramethyldecynediol, and glycidyl ether capped acetylenic diol ethoxylates (such as those described in U.S. Pat. No. 6,717,019, which is herein incorporated by reference). Examples of commercial defoaming surfactants include Surfynol 440, Surfynol 104, Surfynol MD-20, Troysol S366, Coastal 1017F, Aldo LF, Dow DB-100, and Dow DSP. In some embodiments, defoaming surfactants are Surfynol MD-20, Surfynol 104, and Troysol S366. In some embodiments, the compositions of the disclosure do not contain a defoaming surfactant.

In some embodiments, the stripping compositions of this disclosure contain the at least one defoaming surfactant in an amount of at least about 0.01% by weight (e.g., at least about 0.03% by weight, at least about 0.05% by weight or at least about 0.1% by weight) and/or at most about 3% by weight (e.g., at most about 2% by weight, at most about 1% by weight or at most about 0.5% by weight).

In addition, in some embodiments, the stripping compositions of the present disclosure can contain additional additives such as, pH adjusting agents (such as organic acids, inorganic acids, and organic bases), corrosion inhibitors, chelating agents, surfactants, organic solvents (e.g., glycol diethers), and biocides, as optional components.

In some embodiments, the stripping compositions of the present disclosure may specifically exclude one or more of the following components, in any combination, if more than one. Such components are selected from the group consisting of oxygen scavengers, amidoximes, oxidizing agents (e.g., peroxides, oxoammonium compounds, inorganic oxidizing agents, and peracids), abrasives (e.g., silica or alumina), fluoride containing compounds, alkali metal and alkaline earth bases (such as NaOH, KOH, magnesium hydroxide, calcium hydroxide and LiOH), metal halide compounds, phosphinic acids, tetrahydrofurfuryl alcohol, glycols, furanyl alcohol, glycerine, saccharides, aryl ethers, N-hydroxy formamide, alkanolamines, N-alkylalkanolamines, sulfonated polymers, metal sulfonates, hydroxylamine, 2-aminobenzothiazole, thiobenzotriazole, sulfonated polyesters, urea compounds, silicate bases, silanes, silicon compounds, surfactants other than a defoaming surfactant, pyrolidone, steric hindered amide solvents such as 1,3-dimethyl-2-piperidone and 1,5-dimethyl-2-piperidone, sulfur compounds other than DMSO or dimethylsulfone or triazole compounds containing sulfur containing substituents, tetrazolium salts, boric acid and derivatives of boric acid, benzimidazoles, non-triazole containing phenolic compounds, chelating agents, and corrosion inhibitors other than the Cu or Al corrosion inhibitors described in this disclosure.

In some embodiments, the stripping compositions of this disclosure contain, consist of, or consist essentially of at least about 30% by weight (e.g., at least about 40% by weight, at least about 50% by weight or at least about 60% by weight) and/or at most about 90% by weight (e.g., at most about 85% by weight, at most about 80% by weight or at most about 75% by weight) of at least one water soluble polar aprotic solvent; optionally, at least about 5% by weight (e.g., at least about 7% by weight, at least about 10% by weight or at least about 12% by weight) and/or at most about 60% by weight (e.g., at most about 45% by weight, at most about 35% by weight or at most about 25% by weight) of at least one alcohol solvent; at least about 0.1% by weight (e.g., at least about 0.5% by weight, at least about 1% by weight or at least about 1.5% by weight) and/or at most about 10% by weight (e.g., at most about 8% by weight, at most about 5% by weight or at most about 3% by weight) of at least one quaternary ammonium hydroxide; at least about 2.5% by weight (e.g., at least about 5% by weight, at least about 7% by weight or at least about 10% by weight) and/or at most about 25% by weight (e.g., at most about 20% by weight, at most about 15% by weight or at most about 12.5% by weight) of water; at least about 0.01% by weight (e.g., at least about 0.05% by weight, at least about 0.1% by weight or at least about 0.5% by weight) and/or at most about 10% by weight (e.g., at most about 7% by weight, at most about 5% by weight or at most about 2% by weight) of at least one copper corrosion inhibitor selected from 6-substituted 2,4-diamino-1,3,5-triazines; optionally, at least about 0.01% by weight (e.g., at least about 0.03% by weight, at least about 0.05% by weight or at least about 0.1% by weight) and/or at most about 3% by weight (e.g., at most about 2% by weight, at most about 1')/0 by weight or at most about 0.5% by weight) of at least one defoaming surfactant; at least about 5 ppm (e.g., at least about 7 ppm, at least about 8 ppm, or at least about 10 ppm) and/or at most about 40 ppm (e.g., at most about 35 ppm, at most about 25 ppm, at most about 20 ppm, or at most about 15 ppm) of at least one Group II metal cation; at least about 0.1% by weight (e.g., at least about 0.5% by weight, at least about 1% by weight or at least about 1.5% by weight) and/or at most about 10% by weight (e.g., at most about 8% by weight, at most about 5% by weight or at most about 3% by weight) of at least one compound having at least three hydroxyl groups; at least about 0.1% by weight (e.g., at least about 0.2% by weight, at least about 0.3% by weight or at least about 0.4% by weight) and/or at most about 1.5% by weight (e.g., at most about 1.2% by weight, at most about 0.9% by weight or at most about 0.6% by weight) of at least one carboxylic acid.

The stripping compositions of the present disclosure generally are alkaline in nature. In some embodiments, the stripping compositions of the present disclosure has a pH of at least about 13 (e.g., at least about 13.5 or at least about 14). Without wishing to be bound by theory, it is believed that the alkaline nature of the stripping compositions can facilitate removal of a photoresist on a semiconductor substrate.

One embodiment of the present disclosure is a method of stripping or removing photoresist from a semiconductor substrate. The method includes contacting a semiconductor substrate containing a photoresist or a photoresist residue with a stripping composition described herein for a time and at a temperature sufficient to remove the photoresist resist or photoresist residue from the substrate surface. The method can further include rinsing the semiconductor substrate with a rinse solvent after the contacting step and/or drying the semiconductor substrate after the rinsing step. In some embodiments, the method does not substantially remove Cu or Al in the semiconductor substrate.

In some embodiments, the photoresist stripping methods include the steps of:

(A) providing a semiconductor substrate having a photoresist coating or a photoresist residue;

(B) contacting said semiconductor substrate with a stripping composition described herein to remove the photoresist coating or the photoresist residue;

(C) rinsing said semiconductor substrate with a suitable rinse solvent; and (D) optionally, drying said semiconductor substrate by any suitable means that removes the rinse solvent and does not compromise the integrity of said semiconductor substrate. In some embodiments, the stripping method further includes forming a semiconductor device (e.g., an integrated circuit device such as a semiconductor chip) from the semiconductor substrate obtained by the method described above.

The semiconductor substrates to be stripped in this method have at least one photoresist (e.g., a positive or negative photoresist) that needs to be removed. Semiconductor substrates typically are constructed of silicon, silicon germanium, Group III-V compounds like GaAs, or any combination thereof. The semiconductor substrates may additionally contain exposed integrated circuit structures such as interconnect features like metal lines and dielectric materials. Metals and metal alloys used for interconnect features include, but are not limited to, aluminum, aluminum alloyed with copper, copper, titanium, tantalum, cobalt, nickel, silicon, polysilicon titanium nitride, tantalum nitride, tin, tungsten, SnAg, SnAg/Ni, CuNiSn, CuCoCu, and CoSn. Said semiconductor substrate may also contain layers of interlayer dielectrics, silicon oxide, silicon nitride, silicon carbide, titanium oxide, and carbon doped silicon oxides.

The semiconductor substrate can be contacted with a stripping composition by any suitable method, such as placing the stripping composition into a tank and immersing and/or submerging the semiconductor substrate into the stripping composition, spraying the stripping composition onto the semiconductor substrate, streaming the stripping composition onto the semiconductor substrate, or any combinations thereof. In some embodiments, the semiconductor substrate is immersed into the stripping composition.

The stripping compositions of the present disclosure can be effectively used up to a temperature of about 90° C. In some embodiments, the stripping compositions can be used from about 25° C. to about 80° C. In some embodiments, the stripping compositions can be employed in the temperature range from about 30° C. to about 60° C. In some embodiments the stripping compositions can be employed in the temperature range of about 40° C. to about 60° C. Ultimately for safety reasons, the maximum temperature is kept significantly below the flash points of the solvents being employed.

Similarly, stripping times can vary over a wide range depending on the particular stripping method, temperature and stripping composition employed. When stripping in an immersion batch type process, a suitable time range is, for example, up to about 60 minutes. In some embodiments, a suitable time range for a batch type process is from about 1 minute to about 60 minutes. In some embodiments, a suitable time range for a batch type process is from about 3 minutes to about 20 minutes. In some embodiments, a suitable time range for a batch type stripping process is from about 4 minutes to about 15 minutes.

Stripping times for a single wafer process can range from about 10 seconds to about 5 minutes. In some embodiments, a stripping time for a single wafer process can range from about 15 seconds to about 4 minutes. In some embodiments, a stripping time for a single wafer process can range from about 15 seconds to about 3 minutes. In some embodiments, a stripping time for a single wafer process can range from about 20 seconds to about 2 minutes. In some embodiments, one or more applications of a stripping composition can take place. The volume of a stripping composition employed in single wafer process is typically sufficient to fully cover the substrate, which will depend on the substrate size and the surface tension of the stripping composition.

To further promote the stripping ability of the stripping compositions of the present disclosure, mechanical agitation means can be employed. Examples of suitable agitation means include circulation of a stripping composition over the substrate, streaming or spraying a stripping composition over the substrate, and ultrasonic or megasonic agitation during the stripping process. The orientation of the semiconductor substrate relative to the ground can be at any angle. In some embodiments, horizontal or vertical orientations are suitable.

The stripping compositions of the present disclosure can be used in stripping tools known to those skilled in the art. A significant advantage of the stripping compositions of the present disclosure is that they include relatively non-toxic, non-corrosive, and non-reactive components in whole and in part, whereby the compositions are stable in a wide range of temperatures and process times. The stripping compositions of the present disclosure are generally chemically compatible with practically all materials used to construct existing and proposed semiconductor wafer stripping process tools for batch and single wafer stripping.

Subsequent to the stripping, the semiconductor substrate is rinsed with a suitable rinse solvent for about 5 seconds up to about 5 minutes with or without agitation means. Examples of suitable rinse solvents include, but are not limited to, deionized (DI) water, methanol, ethanol, isopropyl alcohol, N-methylpyrrolidinone, gamma-butyrolactone, dimethyl sulfoxide, ethyl lactate and propylene glycol monomethyl ether acetate. In some embodiments, examples of rinse solvents include, but are not limited to, DI water, methanol, ethanol and isopropyl alcohol. In some embodiments, rinse solvents are DI water and isopropyl alcohol. In some embodiments, the rinse solvent is DI water. The solvent can be applied using means similar to that used in applying a stripping composition described herein. The stripping composition may have been removed from the semiconductor substrate prior to the start of the rinsing step or it may still be in contact with the semiconductor substrate at the start of the rinsing step. In some embodiments, the temperature employed in the rinsing step is between 16° C. and 27° C.

Optionally, the semiconductor substrate is dried after the rinsing step. Any suitable drying means known in the art can be employed. Examples of suitable drying means include spin drying, flowing a dry gas across the semiconductor substrate, or heating the semiconductor substrate with a heating means such as a hotplate or infrared lamp, Maragoni drying, rotagoni drying, IPA drying or any combinations thereof. Drying times will be dependent on the specific method employed but are typically on the order of 30 seconds up to several minutes.

In some embodiments, the semiconductor substrate can subsequently be processed to form one or more additional circuits on the substrate or can be processed to form into a semiconductor chip by, for example, assembling (e.g., dicing and bonding) and packaging (e.g., chip sealing).

The present disclosure is illustrated in more detail with reference to the following examples, which are for illustrative purposes and should not be construed as limiting the scope of the present disclosure.

EXAMPLES

General Procedure 1 (Stripper Formulation)

Stripping compositions were prepared by mixing, while stirring, the organic solvents, and ultra-pure deionized water (DIW). Aqueous (25%) TMAH was added slowly while stirring, followed by the Cu inhibitor. After a uniform solution was achieved, the remaining components were added, followed by the optional components, if used. All components used were commercially available and of high purity.

pH measurements, if desired, were taken at ambient temperature (17-25° C.) after all components were fully dissolved. Beckman Coulter φ 400 Series Handheld meters can be used for these pH measurements.

General Procedure 2 (Stripping Tests)

Stripping tests were conducted using customer provided full 200 mm or 300 mm wafers. The customer-provided wafers with thick positive or negative-tone resists were diced into small coupons containing integral dies for the stripping tests. The samples were placed in a 600 mL volume glass beaker containing approximately 200 mL of the stripping compositions of the present disclosure. Prior to immersion of a sample into a stripping composition, the stripping composition was pre-heated to the test condition temperature (typically 50° C. to 80° C.) on a hotplate set at approximately 250 rpm for controlled solution agitation. The stripping tests were then carried out by placing the sample into the heated stripping composition with device side "face to" the stir bar and leaving the sample in the solution with constant agitation for the test condition time (typically 0.5 to 10 minutes). Once the sample was exposed in the solution for the duration of the test condition, the sample was quickly removed from the test solution with a pair of plastic "locking" tweezers, and placed in a 600 mL plastic beaker filled with approximately 500 mL of ultra-pure deionized water at ambient temperature (~17° C.). The sample was left in the beaker of deionized water for approximately 10-20 seconds with mild agitation, and then removed and placed under an ultra-pure de-ionized water stream (flow rate ~2 L/min) at ambient temperature for an additional 40-50 seconds, and then removed. Upon removal, the sample was immediately exposed to nitrogen gas from a hand held nitrogen blowing gun which caused any droplets on the sample surface to be blown off the sample, and further to completely dry the sample device surface and backside. Following this final nitrogen drying step, the sample was removed from the plastic tweezers holder and placed into a covered plastic carrier with the device side up for short term storage no greater than about 2 hours. Scanning electron microscopy (SEM) images were then collected for key features (i.e. SnAg/Ni bumps) on the stripped test sample device surface.

General Procedure 3 (Etch Rate Measurements)

Etch rates of various substrate materials were measured to determine the corrosivity of tested stripping compositions. Coupons (Cu, Al, W, Ni, Sn, Co, silicon nitride, or poly-Si) from wafers having a coating of the photoresist material being tested were immersed in a certain volume of a test stripping composition pre-heated to the test condition temperature. After immersion in the test stripping composition for the duration of the test condition time, the coupons were quickly removed from the test composition with a pair of plastic "locking" tweezers, rinsed by deionized water, blow dried by $N_2$ gas flow.

The thickness of dielectric films on the coupons before and after dipping in the test composition was measured by either an Ellipsometer or Filmetrics film thickness measuring devices. The difference in film thickness divided by the etch time was used to calculate the etch rate.

The sheet resistance of the metal film on the coupons before and after dipping in the test composition was measured by a Resmap 4-point probe instrument. On metals except Sn, a correlation between film thickness and sheet resistance was employed to determine film thickness. The etch rate was determined by dividing the film thickness change by the immersion time in the composition.

Comparative Example 1 (CE-1) and Formulation Examples 1-3 (FE-1 to FE-33)

The data in Table 1 illustrate two aspects of the effect of the sugar alcohol glycerol on formulations of the disclosure. First, compared to CE-1 (with no glycerol), FE-1 to FE-3 demonstrate that glycerol aids in the dissolution of Ca into the alkaline semi-aqueous formulations. Clear formulations result when glycerol is included in the formulations, whereas undissolved white powder is observed in CE-1. Second, improved Al etch resistance is observed (i.e., decreased Al etch rates) as the glycerol concentration increases.

TABLE 1

| | Wt % Except Ca (Ca conc. given in PPM) | | | |
| --- | --- | --- | --- | --- |
| | CE-1 | FE-1 | FE-2 | FE-3 |
| Ca | 30 ppm | 30 ppm | 30 ppm | 30 ppm |
| DMSO | 71.54 | 70.89 | 70.24 | 68.38 |
| MMB | 11.11 | 11.00 | 10.90 | 10.62 |
| TMAH | 2.31 | 2.29 | 2.27 | 2.21 |
| Benzoguanamine | 0.46 | 0.46 | 0.45 | 0.44 |
| MD-20 | 0.19 | 0.18 | 0.18 | 0.18 |
| Citric acid | 0.46 | 0.46 | 0.45 | 0.44 |
| Glycerol | 0.00 | 0.92 | 1.82 | 4.42 |
| DIW | 13.88 | 13.76 | 13.63 | 13.27 |
| Ca citrate tetrahydrate | 0.041 | 0.040 | 0.040 | 0.039 |
| Look after 1 h stirring @RT | White powder | Clear | Clear | Clear |
| Al ER (70 C./10 min.) | 4.2 | 2.1 | −0.9 | 0.9 |
| Cu ER (70 C./10 min.) | 2.4 | 2.2 | 1.6 | 1.1 |

TABLE 1-continued

| | Wt % Except Ca (Ca conc. given in PPM) | | | |
|---|---|---|---|---|
| | CE-1 | FE-1 | FE-2 | FE-3 |
| TSV (70 C./2 min.) | 100% clean | 100% clean | 100% clean | 90% clean |
| CuNiSn bump (70 C./2 min.) | 95% clean | 100% clean | 100% clean | 95% clean |

DMSO = dimethylsulfoxide
MMB = 3-methoxy-3-methyl-butanol
TMAH = tetramethylammonium hydroxide
MD-20 = acetylenic surfactant
DIW = de-ionized water
TSV = through silicon vias Formulation Examples 4-8 (FE-4 to FE-8) and
Comparative Examples 2 and 3 (CE-2 and CE-3)

TABLE 2

| Wt % Except Ca (Ca conc. given in PPM) | FE-4 | FE-5 | FE-6 | FE-7 | FE-8 | CE-2 | CE-3 |
|---|---|---|---|---|---|---|---|
| Ca | 12 ppm | 27 ppm | 27 ppm | 27 ppm | 27 ppm | 0 ppm | 0 ppm |
| DMSO | 79.36 | 78.32 | 76.98 | 75.68 | 74.43 | 76.99 | 75.69 |
| TMAH | 2.20 | 3.05 | 2.99 | 2.94 | 2.89 | 2.99 | 2.94 |
| Benzoguanamine | 0.44 | 0.44 | 0.43 | 0.42 | 0.41 | 0.43 | 0.42 |
| Citric acid | 0.35 | 0.35 | 0.34 | 0.34 | 0.33 | 0.34 | 0.34 |
| Glycerol | 4.41 | 4.35 | 5.99 | 7.57 | 9.10 | 5.99 | 7.57 |
| DIW | 13.23 | 13.49 | 13.26 | 13.03 | 12.82 | 13.26 | 13.04 |
| Ca citrate tetrahydrate | 0.007 | 0.013 | 0.013 | 0.013 | 0.012 | 0.000 | 0.000 |
| Look after 20 h stirring @RT | Clear | Clear | Clear | Clear | Clear | Clear | Clear |
| Al ER (A/min., 70 C./10 min.) | 11.2 | 0.6 | 2.0 | −0.1 | 0.1 | 40.8 | 33.5 |
| 10/1 TSV, (70 C./2 min.) | 100% clean | 100% Clean | 100% Clean | 100% Clean | 100% Clean | 100% Clean | 100% Clean |
| CuNiSn bump (70 C./2 min.) | 100% clean | 100% Clean | 95% clean | 100% Clean | 100% Clean | 100% Clean | 100% Clean |

The data in Table 2 demonstrate that formulations containing Group II metal ions were able to suppress Al etch rates as compared to formulations without a Group II metal ion. In these examples, the effect is demonstrated using $Ca^{2+}$ as an exemplary Group II metal ion.

Formulation Examples 9-11 (FE-9 to FE-11) and
Comparative Example 4 (CE-4)

TABLE 3

| | Wt % Except Ca (Ca conc. given in PPM) | | | |
|---|---|---|---|---|
| | FE-9 | FE-10 | CE-4 | FE-11 |
| DMSO | 72.6% | 72.6% | 73.0% | 68.4% |
| MMB | 11.3% | 11.3% | 11.3% | 11.3% |
| TMAH | 2.3% | 2.3% | 2.3% | 2.3% |
| Benzoguanamine | 0.47% | 0.47% | 0.47% | 0.47% |
| MD20 | 0.19% | 0.19% | 0.19% | 0.19% |
| Citric acid | 0.47% | 0.47% | 0% | 0.47% |
| Glycerol | 0.94% | 0.94% | 0.94% | 2.82% |
| DIW | 11.7% | 11.7% | 11.7% | 14.1% |
| Calcium chloride | 0.0080% | 0% | 0% | 0% |
| Calcium Citrate Tetrahydrate | 0% | 0.0408% | 0.0408% | 0.0408% |
| Total | 100.0% | 100.000% | 100.000% | 100.0% |
| Ca Load | 30 ppm | 30 ppm | 30 ppm | 30 ppm |
| Look @70 C. | Clear | Clear | solids in solution after 24 hr stir | Clear |
| Al ER (70 C./10 min.) | 11.4 | −1.8 | 208 | −1 |
| imec Cu ER (70 C./5 min.) | −2.2 | −2.4 | 0 | 3.2 |
| TSV (70 C./2 min.) | 100% | 100% | 100% | 100% |
| Cu bump (70 C./2 min.) | 100% | 100% | 100% | 100% |

The data in Table 3 demonstrate that carboxylic acids facilitated solubilizing the Group II metal ion in the organic solvent based formulations of the disclosure. Without wishing to be bound by theory, it is believed that chelating carboxylic acids (such as citric acid) act in concert with sugar alcohols (such as glycerol) to solubilize the Group II metal ion (e.g., $Ca^{2+}$ in FE-9 to FE-11). Specifically, the results show that formulations FE-9 to FE-11 (which included both citric acid and glycerol) exhibited low Al etch rates. For comparative example 4 (i.e., formulation CE-4 containing glycerol but no citric acid), solids were present in the formulation even after a 24 hour stir, and the Al etch rate for formulation CE-4 was unacceptably high.

In addition, the data in Table 3 demonstrate that the Group II metal ion can be introduced to the formulation by using different Group II metal salts (e.g., calcium chloride, calcium citrate, and the like).

Formulation Examples 12-16 (FE-12 to FE-16)

TABLE 4

| | Wt % except Ca or Sr (Ca or Sr conc. given in PPM) | | | | |
|---|---|---|---|---|---|
| | FE-12 | FE-13 | FE-14 | FE-15 | FE-16 |
| Citric acid | 0.34% | 0.34% | 0.68% | 0.34% | 0.34% |
| Glycerol | 7.24% | 0% | 7.24% | 7.24% | 7.24% |
| Sorbitol | 0% | 5.11% | 0% | 0% | 0% |
| DIW | 12.8% | 12.8% | 12.8% | 12.8% | 12.8% |
| Ca citrate tetrahydrate | 0.0106% | 0.0106% | 0.0106% | 0% | 0% |
| Strontium Acetate | 0% | 0% | 0% | 0.0054% | 0.0324% |
| DMSO | 77.1% | 79.2% | 76.7% | 77.1% | 77.1% |
| TMAH | 2.13% | 2.13% | 2.13% | 2.13% | 2.13% |
| Benzoguanamine | 0.43% | 0.43% | 0.43% | 0.43% | 0.43% |
| Ca or Sr | 22 ppm | 22 ppm | 22 ppm | 22 ppm | 134 ppm |
| Look after >24 h stirring @RT | Small amount Powder | Slightly more Powder | Small Powder | No Powder | Small Powder |
| 0.2 μm filtration before beaker test | Yes | Yes | Yes | Yes | Yes |
| Al ER (A/min., 70 C./10 min.) | 5.8 | −0.7 | 9.6 | 5.8 | −1.9 |
| Cu ER (A/min 70 C. 5 min) | −7 | 4.8 | −1.4 | −2 | −1.6 |

The data in Table 4 demonstrate that Group II metal ions other than $Ca^{2+}$ were also able to suppress Al etch rates. Formulation Examples 15 and 16 demonstrate effective Al etch inhibition with $Sr^{2+}$. Table 4 also illustrates the effectiveness of the sugar alcohol sorbitol in solubilizing the Group II metal ion.

Formulation Examples 17-21 (FE-17 to FE-21)

TABLE 5

| Wt % except Ca | FE-17 | FE-18 | FE-19 | FE-20 | FE-21 |
|---|---|---|---|---|---|
| Ca | 18 ppm | 22 ppm | 27 ppm | 22 ppm | 22 ppm |
| DMSO | 76.65 | 76.65 | 76.65 | 76.33 | 75.69 |
| TMAH | 2.13 | 2.13 | 2.13 | 2.54 | 2.94 |
| Benzoguanamine | 0.43 | 0.43 | 0.43 | 0.42 | 0.42 |
| Citric acid | 0.34 | 0.34 | 0.34 | 0.34 | 0.34 |
| Glycerol | 7.67 | 7.67 | 7.67 | 7.63 | 7.57 |
| DIW | 12.78 | 12.78 | 12.78 | 12.72 | 13.03 |
| Ca citrate tetrahydrate | 0.009 | 0.011 | 0.013 | 0.011 | 0.011 |
| Solution after 19 h stirring @RT | Clear | Clear | Clear | Clear | Clear |
| Solution after 40 h stirring @RT | Clear | Clear | Clear | Clear | Clear |
| 0.2 um filtration before beaker test | Done | Done | Done | Done | Done |
| Al ER (A/min., 70 C./10 min.) | 2.3 | 1.5 | −2.3 | 1.0 | −2.5 |
| Cu ER (A/min., 70 C./10 min.) | 0.7 | 0.7 | 1.3 | 1.2 | 1.3 |
| 10/1 TSV, (70 C./2 min.) | Clean | Clean | Clean | Clean | Clean |
| CuNiSn bump (70 C./2 min.) | Clean | Clean | Clean | Clean | Clean |

The data in Table 5 further demonstrate the effectiveness of formulations of the disclosure in removing photoresist from TSV's and micro-bump structures, while maintaining excellent Al and Cu compatibility.

Formulation Examples 22 to 43

To further elaborate on the compositions of this disclosure, additional formulations are described in Table 6.

TABLE 6

| Formulation Example Number | Solvent (%) | Carboxylic acid (%) | Quat. Hydroxide (%) | H$_2$O (%) | Cu Etch Inhibitor (%) | Multi-hydroxy compound (%) | Group II metal ion (M$^{2+}$, ppm) |
|---|---|---|---|---|---|---|---|
| FE-22 | NMP (89.8) | Citric (0.1) | tetramethyl ammonium hydroxide (2) | 7.5 | 6-methyl-1,3,5-triazine-2,4-diamine (0.5) | Glycerol (0.1) | Mg (18) |
| FE-23 | NMP (88.8) | Maleic (0.2) | choline (2.5) | 7.5 | 1,3,5-Triazine-2,4-diamine, 6-[2-(2-furanyl)ethyl]- (0.5) | Sorbitol (0.5) | Ca (21) |
| FE-24 | DMSO (89.9) | Fumaric (0.3) | tetraethyl-ammonium hydroxide (2) | 6.3 | Benzo-guanamine (0.5) | Mannitol (1.0) | Sr (24) |
| FE-25 | DMSO (71.6) | Lactic (0.4) | tetramethyl ammonium hydroxide (0.5) | 25 | Benzo-guanamine (0.5) | Erythritol (2.0) | Ba (27) |
| FE-26 | DMSO (87.5) | Glycolic (0.5) | benzyl-trimethyl-ammonium hydroxide (1.5) | 2.5 | 6-methyl-1,3,5-triazine-2,4-diamine (5) | Arabitol (3.0) | Mg (30) |
| FE-27 | NMP (74.4) | Oxalic (0.6) | tetramethyl ammonium hydroxide (5) | 15 | 1,3,5-Triazine-2-propanoic acid, 4,6-diamino-, (1) | Isomalt (4.0) | Ca (10) |
| FE-28 | Sulfolane (75.8) | Tartaric (0.7) | tetramethyl ammonium hydroxide (2.5)/ benzyl-trimethyl-ammonium hydroxide (2.5) | 15 | Benzo-guanamine (1) | Lactitol (5.0) | Sr (15) |
| FE-29 | Sulfolane (76.7) | Succinic (0.8) | tetramethyl ammonium hydroxide (3) | 13 | Benzo-guanamine (1)/6-methyl-1,3,5-triazine-2,4-diamine (0.5) | Maltitol (6.0) | Ba (20) |
| FE-30 | DMSO (78.4) | Benzoic (0.9) | tetramethyl ammonium hydroxide (3) | 10 | 6-methyl-1,3,5-triazine-2,4-diamine (0.7) | Xylitol (7.0) | Mg (25) |
| FE-31 | 1,3-dimethyl-2-imidazolidinone (64) | Citric (1.0) | benzyl-trimethyl-ammonium hydroxide (10) | 12 | 6-methyl-1,3,5-triazine-2,4-diamine (5) | Threitol (8.0) | Ca (30) |
| FE-32 | dimethyl sulfone (63.1) | Maleic (1.1) | tetramethyl ammonium hydroxide (5.8) | 20 | 6-[(phenylthio)methyl]-,1,3,5-Triazine-2,4-diamine (1) | Ribitol (9.0) | Sr (35) |
| FE-33 | DMSO (74.3) | Fumaric (1.2) | tetramethyl ammonium hydroxide (4) | 10 | Benzo-guanamine (0.5) | Galactitol (10.0) | Ba (40) |
| FE-34 | NMP (80.1) | Lactic (1.3) | choline (3.5) | 14 | 6-methyl-1,3,5-triazine-2,4-diamine (1) | Iditol (0.1) | Mg (12) |
| FE-35 | DMSO (75.1) | Glycolic (1.4) | tetramethyl ammonium hydroxide (5) | 15 | Benzo-guanamine (3) | Inositol (0.5) | Ca (15) |
| FE-36 | DMSO (84) | Oxalic (1.5) | tetramethyl ammonium hydroxide (0.5) | 12 | 6-methyl-1,3,5-triazine-2,4-diamine (1) | Glycerol (1.0) | Sr (18) |

TABLE 6-continued

| Formulation Example Number | Solvent (%) | Carboxylic acid (%) | Quat. Hydroxide (%) | $H_2O$ (%) | Cu Etch Inhibitor (%) | Multi-hydroxy compound (%) | Group II metal ion ($M^{2+}$, ppm) |
|---|---|---|---|---|---|---|---|
| FE-37 | DMSO (76.6) | Tartaric (0.1) | tetraethyl-ammonium hydroxide (2) | 18 | Benzo-guanamine (1.3) | Sorbitol (2.0) | Ba (21) |
| FE-38 | 1,3-dimethyl-2-imidazolidinone (61.8) | Succinic (0.2) | benzyl-trimethyl-ammonium hydroxide (10) | 20 | 6-methyl-1,3,5-triazine-2,4-diamine (5) | Mannitol (3.0) | Mg (24) |
| FE-39 | Sulfolane (76.2) | Benzoic (0.3) | tetramethyl ammonium hydroxide (2.5)/ benzyl-trimethyl-ammonium hydroxide (2.5) | 16 | Benzo-guanamine (1) | Lactitol (4.0) | Ca (27) |
| FE-40 | dimethyl sulfone (67.8) | citric (0.4) | tetramethyl ammonium hydroxide (5.8) | 20 | 6-[(phenylthio)methyl]-,1,3,5-Triazine-2,4-diamine (1) | Arabitol (5.0) | Sr (30) |
| FE-41 | DMSO (73) | Maleic (0.5) | tetramethyl ammonium hydroxide (5) | 15 | Benzo-guanamine (0.5)/6-methyl-1,3,5-triazine-2,4-diamine (0.5) | Threitol (6.0) | Ba (33) |
| FE-42 | dimethyl sulfone (72.3) | Fumaric (0.6) | choline (0.1) | 10 | 6-methyl-1,3,5-triazine-2,4-diamine (10) | Isomalt (7.0) | Mg (36) |
| FE-43 | NMP (81.5) | Lactic (0.7) | tetramethyl ammonium hydroxide (2) | 7.3 | 6-methyl-1,3,5-triazine-2,4-diamine (0.5) | Ribitol (8.0) | Ca (39) |

While the disclosure has been described in detail with reference to certain embodiments thereof, it is understood that modifications and variations are within the spirit and scope of that which is described and claimed.

What is claimed is:

1. A composition, comprising:
   1) at least one water soluble polar aprotic organic solvent;
   2) at least one quaternary ammonium hydroxide;
   3) at least one carboxylic acid;
   4) at least one Group II metal cation;
   5) at least one copper corrosion inhibitor selected from the group consisting of 6-substituted-2,4-diamino-1,3,5-triazines; and
   6) water.

2. The composition of claim 1, wherein the at least one quaternary ammonium hydroxide comprises a compound of the formula $[NR_1R_2R_3R_4]^+OH$, in which each of $R_1$, $R_2$, $R_3$, and $R_4$, independently, is a linear, branched, or cyclic alkyl group optionally substituted by hydroxy, a substituted or unsubstituted phenyl group, or a substituted or unsubstituted benzyl group.

3. The composition of claim 2, wherein each of $R_1$, $R_2$, $R_3$, and $R_4$, independently, is a $C_1$-$C_4$ alkyl group, a hydroxyethyl group, a phenyl group, or a benzyl group.

4. The composition of claim 1, wherein the composition comprises the at least one quaternary ammonium hydroxide in an amount from about 0.1 wt % to about 10 wt %.

5. The composition of claim 1, wherein the at least one copper corrosion inhibitor comprises a 6-substituted-2,4-diamino-1,3,5-triazine, the substituent at the 6-position being a linear or branched, substituted or unsubstituted $C_1$-$C_{12}$ alkyl group, a substituted or unsubstituted $C_3$-$C_{12}$ cycloalkyl group, a substituted or unsubstituted aryl group, —$SCH_2R^{100}$, —$N(R^{100}R^{101})$, or imidyl, in which each of $R^{100}$ and $R^{101}$, independently, is a linear or branched, substituted or unsubstituted $C_1$-$C_{12}$ alkyl group optionally containing a nitrogen or oxygen atom in the alkyl chain, a substituted or unsubstituted $C_3$-$C_{12}$ cycloalkyl group optionally containing a nitrogen or oxygen atom in the cycloalkyl ring, a substituted or unsubstituted aryl group, or $R^{100}$ and $R^{101}$, together with the atom to which they are attached, form a ring.

6. The composition of claim 1, wherein the at least one copper corrosion inhibitor comprises 6-phenyl-2,4-diamino-1,3,5-triazine or 6-methyl-2,4-diamino-1,3,5-triazine.

7. The composition of claim 1, wherein the composition comprises the at least one copper corrosion inhibitor in an amount from about 0.1 wt % to about 10 wt %.

8. The composition of claim 1, wherein the at least one water soluble polar aprotic organic solvent comprises dimethyl sulfoxide, sulfolane, dimethylsulfone, N,N-dimethylformamide, N,N-dimethylacetamide, N-methylpyrrolidone, gamma-butyrolactone, propylene carbonate, 1,3-dimethyl-2-imidazolidinone, or a mixture thereof.

9. The composition of claim 1, wherein the composition comprises the at least one water soluble polar aprotic organic solvent in an amount from about 30 wt % to about 90 wt %.

10. The composition of claim 1, further comprising at least one alcohol solvent.

11. The composition of claim 10, wherein the at least one alcohol solvent comprises an alkane diol, a glycol, an alkoxyalcohol, a saturated aliphatic monohydric alcohol, an unsaturated non-aromatic monohydric alcohol, an alcohol containing a ring structure, or a mixture thereof.

12. The composition of claim 10, wherein the composition comprises the at least one alcohol solvent in an amount from about 5 wt % to about 60 wt %.

13. The composition of claim 1, wherein the composition comprises the water in an amount from about 2.5 wt % to about 25 wt %.

14. The composition of claim 1, further comprising at least one defoaming surfactant.

15. The composition of claim 14, wherein the composition comprises the at least one defoaming surfactant in an amount from about 0.01 wt % to about 3 wt %.

16. The composition of claim 1, wherein the at least one carboxylic acid is selected from the group consisting of monocarboxylic acids, bicarboxylic acids, tricarboxylic acids, α-hydroxyacids and β-hydroxyacids of monocarboxylic acids, α-hydroxyacids and β-hydroxyacids of bicarboxylic acids, and α-hydroxyacids and β-hydroxyacids of tricarboxylic acids.

17. The composition of claim 16, wherein the at least one carboxylic acid comprises citric acid, maleic acid, fumaric acid, lactic acid, glycolic acid, oxalic acid, tartaric acid, succinic acid, or benzoic acid.

18. The composition of claim 17, wherein the at least one carboxylic acid comprises citric acid.

19. The composition of claim 1, wherein the composition comprises the at least one carboxylic acid in an amount from about 0.1 wt % to about 1.5 wt %.

20. The composition of claim 1, wherein the at least one Group II metal cation comprises $Mg^{2+}$, $Ca^{2+}$, $Sr^{2+}$, or $Ba^{2+}$.

21. The composition of claim 1, wherein the at least one Group II metal cation comprises $Ca^{2+}$.

22. The composition of claim 1, wherein the composition comprises the at least one Group II metal cation in an amount from about 5 ppm to about 40 ppm.

23. The composition of claim 1, wherein the composition has a pH of at least about 13.

24. A method, comprising:
    contacting a semiconductor substrate containing a photoresist or a photoresist residue with the composition of claim 1 to remove the photoresist or photoresist residue.

25. The method of claim 24, further comprising rinsing the semiconductor substrate with a rinse solvent after the contacting step.

26. The method of claim 25, further comprising drying the semiconductor substrate after the rinsing step.

27. The method of claim 24, wherein the method does not substantially remove Cu or Al in the semiconductor substrate.

28. A composition, comprising:
    1) at least one water soluble polar aprotic organic solvent in an amount of at least about 75 wt % of the composition;
    2) at least one quaternary ammonium hydroxide;
    3) at least one copper corrosion inhibitor selected from the group consisting of 6-substituted-2,4-diamino-1,3,5-triazines; and
    4) water.

29. The composition of claim 28, further comprising at least one defoaming surfactant.

30. The composition of claim 1, comprising:
    1) at least one water soluble polar aprotic organic solvent in an amount from about 30 wt % to about 90 wt % of the composition;
    2) at least one quaternary ammonium hydroxide in an amount from about 0.1 wt % to about 10 wt % of the composition;
    3) at least one carboxylic acid in an amount from about 0.1 wt % to about 1.5 wt % of the composition;
    4) at least one Group II metal cation in an amount from about 5 ppm to about 40 ppm of the composition;
    5) at least one copper corrosion inhibitor selected from the group consisting of 6-substituted-2,4-diamino-1,3,5-triazines, the at least one copper corrosion inhibitor being in an amount from about 0.1 wt % to about 10 wt %; and
    6) water in an amount from about 2.5 wt % to about 25 wt % of the composition.

31. The composition of claim 28, wherein the at least one quaternary ammonium hydroxide comprises a compound of the formula $[NR_1R_2R_3R_4]^+OH$, in which each of $R_1$, $R_2$, $R_3$, and $R_4$, independently, is a linear, branched, or cyclic alkyl group optionally substituted by hydroxy, a substituted or unsubstituted phenyl group, or a substituted or unsubstituted benzyl group.

32. The composition of claim 31, wherein each of $R_1$, $R_2$, $R_3$, and $R_4$, independently, is a $C_1$-$C_4$ alkyl group, a hydroxyethyl group, a phenyl group, or a benzyl group.

33. The composition of claim 28, wherein the composition comprises the at least one quaternary ammonium hydroxide in an amount from about 0.1 wt % to about 10 wt %.

34. The composition of claim 28, wherein the at least one copper corrosion inhibitor comprises a 6-substituted-2,4-diamino-1,3,5-triazine, the substituent at the 6-position being a linear or branched, substituted or unsubstituted $C_1$-$C_{12}$ alkyl group, a substituted or unsubstituted $C_3$-$C_{12}$ cycloalkyl group, a substituted or unsubstituted aryl group, $-SCH_2R^{100}$, $-N(R^{100}R^{101})$ or imidyl, in which each of $R^{100}$ and $R^{101}$, independently, is a linear or branched, substituted or unsubstituted $C_1$-$C_{12}$ alkyl group optionally containing a nitrogen or oxygen atom in the alkyl chain, a substituted or unsubstituted $C_3$-$C_{12}$ cycloalkyl group optionally containing a nitrogen or oxygen atom in the cycloalkyl ring, a substituted or unsubstituted aryl group, or $R^{100}$ and $R^{101}$, together with the atom to which they are attached, form a ring.

35. The composition of claim 28, wherein the at least one copper corrosion inhibitor comprises 6-phenyl-2,4-diamino-1,3,5-triazine or 6-methyl-2,4-diamino-1,3,5-triazine.

36. The composition of claim 28, wherein the composition comprises the at least one copper corrosion inhibitor in an amount from about 0.1 wt % to about 10 wt %.

37. The composition of claim 28, wherein the at least one water soluble polar aprotic organic solvent comprises dimethyl sulfoxide, sulfolane, dimethylsulfone, N,N-dimethylformamide, N,N-dimethylacetamide, N-methylpyrrolidone, gamma-butyrolactone, propylene carbonate, 1,3-dimethyl-2-imidazolidinone, or a mixture thereof.

38. The composition of claim 28, wherein the composition comprises the at least one water soluble polar aprotic organic solvent in an amount from about 75 wt % to about 90 wt %.

39. The composition of claim 28, wherein the composition comprises the water in an amount from about 2.5 wt % to about 25 wt %.

40. The composition of claim 28, wherein the composition has a pH of at least about 13.

41. The composition of claim 28, comprising:
1) at least one water soluble polar aprotic organic solvent in an amount of at least about 75 wt % of the composition;
2) at least one quaternary ammonium hydroxide in an amount from about 0.1 wt % to about 10 wt % of the composition;
3) at least one copper corrosion inhibitor selected from the group consisting of 6-substituted-2,4-diamino-1,3,5-triazines, the at least one copper corrosion inhibitor being in an amount from about 0.1 wt % to about 10 wt %; and
4) water in an amount from about 2.5 wt % to about 12.5 wt % of the composition.

* * * * *